United States Patent
Leschkies et al.

(10) Patent No.: US 11,400,545 B2
(45) Date of Patent: Aug. 2, 2022

(54) LASER ABLATION FOR PACKAGE FABRICATION

(71) Applicant: Applied Materials, Inc., Santa Clara, CA (US)

(72) Inventors: Kurtis Leschkies, San Jose, CA (US); Wei-Sheng Lei, San Jose, CA (US); Jeffrey L. Franklin, Albuquerque, NM (US); Jean Delmas, Santa Clara, CA (US); Han-Wen Chen, Cupertino, CA (US); Giback Park, San Jose, CA (US); Steven Verhaverbeke, San Francisco, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 207 days.

(21) Appl. No.: 16/871,302

(22) Filed: May 11, 2020

(65) Prior Publication Data
US 2021/0346983 A1   Nov. 11, 2021

(51) Int. Cl.
*H01L 21/00* (2006.01)
*B23K 26/0622* (2014.01)
(Continued)

(52) U.S. Cl.
CPC ........ *B23K 26/0622* (2015.10); *B23K 26/382* (2015.10); *B23K 26/40* (2013.01);
(Continued)

(58) Field of Classification Search
CPC ... H01L 21/486; H01L 25/50; B23K 26/0622; B23K 26/0624; B23K 26/382; B23K 26/40
(Continued)

(56) References Cited

U.S. PATENT DOCUMENTS

| 4,073,610 A | 2/1978 | Cox |
| 5,126,016 A | 6/1992 | Glenning et al. |

(Continued)

FOREIGN PATENT DOCUMENTS

| CA | 2481616 C | 1/2013 |
| CN | 1971894 A | 5/2007 |

(Continued)

OTHER PUBLICATIONS

PCT International Search Report and Written Opinion dated Feb. 17, 2021 for International Application No. PCT/US2020/057787.

(Continued)

*Primary Examiner* — Brook Kebede
(74) *Attorney, Agent, or Firm* — Patterson + Sheridan LLP (57) ABSTRACT

A method of fabricating a frame to enclose one or more semiconductor dies includes forming one or more features including one or more cavities and one or more through-vias in a substrate by a first laser ablation process, filling the one or more through-vias with a dielectric material, and forming a via-in-via in the dielectric material filled in each of the one or more through-vias by a second laser ablation process. The one or more cavities is configured to enclose one or more semiconductor dies therein. In the first laser ablation process, frequency, pulse width, and pulse energy of a first pulsed laser beam to irradiate the substrate are tuned based on a depth of the one or more features. In the second laser ablation process, frequency, pulse width, and pulse energy of a second pulsed laser beam to irradiate the dielectric material are tuned based on a depth of the via-in-via.

20 Claims, 8 Drawing Sheets

(51) Int. Cl.
  *B23K 26/382* (2014.01)
  *B23K 26/40* (2014.01)
  *H01L 25/00* (2006.01)
  *H01L 21/48* (2006.01)
  *B23K 103/00* (2006.01)
  *B23K 101/40* (2006.01)

(52) U.S. Cl.
  CPC .......... *H01L 21/486* (2013.01); *H01L 25/50* (2013.01); *B23K 2101/40* (2018.08); *B23K 2103/56* (2018.08)

(58) Field of Classification Search
  USPC .................................................. 438/107
  See application file for complete search history.

(56) References Cited

U.S. PATENT DOCUMENTS

| | | | |
|---|---|---|---|
| 5,268,194 A | 12/1993 | Kawakami et al. | |
| 5,353,195 A | 10/1994 | Fillion et al. | |
| 5,367,143 A * | 11/1994 | White, Jr. | B23K 26/066 219/121.73 |
| 5,374,788 A | 12/1994 | Endoh et al. | |
| 5,474,834 A | 12/1995 | Tanahashi et al. | |
| 5,670,262 A | 9/1997 | Dalman | |
| 5,767,480 A | 6/1998 | Anglin et al. | |
| 5,783,870 A | 7/1998 | Mostafazadeh et al. | |
| 5,841,102 A | 11/1998 | Noddin | |
| 5,878,485 A | 3/1999 | Wood et al. | |
| 6,039,889 A | 3/2000 | Zhang et al. | |
| 6,087,719 A | 7/2000 | Tsunashima | |
| 6,117,704 A | 9/2000 | Yamaguchi et al. | |
| 6,211,485 B1 | 4/2001 | Burgess | |
| 6,384,473 B1 | 5/2002 | Peterson et al. | |
| 6,388,202 B1 | 5/2002 | Swirbel et al. | |
| 6,388,207 B1 | 5/2002 | Figueroa et al. | |
| 6,459,046 B1 | 10/2002 | Ochi et al. | |
| 6,465,084 B1 | 10/2002 | Curcio et al. | |
| 6,489,670 B1 | 12/2002 | Peterson et al. | |
| 6,495,895 B1 | 12/2002 | Peterson et al. | |
| 6,506,632 B1 | 1/2003 | Cheng et al. | |
| 6,512,182 B2 | 1/2003 | Takeuchi et al. | |
| 6,538,312 B1 | 3/2003 | Peterson et al. | |
| 6,555,906 B2 | 4/2003 | Towle et al. | |
| 6,576,869 B1 | 6/2003 | Gower et al. | |
| 6,593,240 B1 | 7/2003 | Page | |
| 6,631,558 B2 | 10/2003 | Burgess | |
| 6,661,084 B1 | 12/2003 | Peterson et al. | |
| 6,713,719 B1 | 3/2004 | De Steur et al. | |
| 6,724,638 B1 | 4/2004 | Inagaki et al. | |
| 6,775,907 B1 | 8/2004 | Boyko et al. | |
| 6,781,093 B2 | 8/2004 | Conlon et al. | |
| 6,799,369 B2 | 10/2004 | Ochi et al. | |
| 6,894,399 B2 | 5/2005 | Vu et al. | |
| 7,028,400 B1 | 4/2006 | Hiner et al. | |
| 7,062,845 B2 | 6/2006 | Burgess | |
| 7,064,069 B2 | 6/2006 | Draney et al. | |
| 7,078,788 B2 | 7/2006 | Vu et al. | |
| 7,091,589 B2 | 8/2006 | Mori et al. | |
| 7,091,593 B2 | 8/2006 | Ishimaru et al. | |
| 7,105,931 B2 | 9/2006 | Attarwala | |
| 7,129,117 B2 | 10/2006 | Hsu | |
| 7,166,914 B2 | 1/2007 | DiStefano et al. | |
| 7,170,152 B2 | 1/2007 | Huang et al. | |
| 7,192,807 B1 | 3/2007 | Huemoeller et al. | |
| 7,211,899 B2 | 5/2007 | Taniguchi et al. | |
| 7,271,012 B2 | 9/2007 | Anderson | |
| 7,274,099 B2 | 9/2007 | Hsu | |
| 7,276,446 B2 | 10/2007 | Robinson et al. | |
| 7,279,357 B2 | 10/2007 | Shimoishizaka et al. | |
| 7,312,405 B2 | 12/2007 | Hsu | |
| 7,321,164 B2 | 1/2008 | Hsu | |
| 7,449,363 B2 | 11/2008 | Hsu | |
| 7,458,794 B2 | 12/2008 | Schwaighofer et al. | |
| 7,511,365 B2 | 3/2009 | Wu et al. | |
| 7,690,109 B2 | 4/2010 | Mori et al. | |
| 7,714,431 B1 | 5/2010 | Huemoeller et al. | |
| 7,723,838 B2 | 5/2010 | Takeuchi et al. | |
| 7,754,530 B2 | 7/2010 | Wu et al. | |
| 7,808,799 B2 | 10/2010 | Kawabe et al. | |
| 7,839,649 B2 | 11/2010 | Hsu | |
| 7,843,064 B2 | 11/2010 | Kuo et al. | |
| 7,852,634 B2 | 12/2010 | Sakamoto et al. | |
| 7,855,460 B2 | 12/2010 | Kuwajima | |
| 7,868,464 B2 | 1/2011 | Kawabata et al. | |
| 7,887,712 B2 | 2/2011 | Boyle et al. | |
| 7,914,693 B2 | 3/2011 | Jeong et al. | |
| 7,915,737 B2 | 3/2011 | Nakasato et al. | |
| 7,932,595 B1 | 4/2011 | Huemoeller et al. | |
| 7,932,608 B2 | 4/2011 | Tseng et al. | |
| 7,955,942 B2 | 6/2011 | Pagaila et al. | |
| 7,978,478 B2 | 7/2011 | Inagaki et al. | |
| 7,982,305 B1 | 7/2011 | Railkar et al. | |
| 7,988,446 B2 | 8/2011 | Yeh et al. | |
| 8,069,560 B2 | 12/2011 | Mori et al. | |
| 8,137,497 B2 | 3/2012 | Sunohara et al. | |
| 8,283,778 B2 | 10/2012 | Trezza | |
| 8,314,343 B2 | 11/2012 | Inoue et al. | |
| 8,367,943 B2 | 2/2013 | Wu et al. | |
| 8,384,203 B2 | 2/2013 | Toh et al. | |
| 8,390,125 B2 | 3/2013 | Tseng et al. | |
| 8,426,246 B2 | 4/2013 | Toh et al. | |
| 8,476,769 B2 | 7/2013 | Chen et al. | |
| 8,518,746 B2 | 8/2013 | Pagaila et al. | |
| 8,536,695 B2 | 9/2013 | Liu et al. | |
| 8,628,383 B2 | 1/2014 | Starling et al. | |
| 8,633,397 B2 | 1/2014 | Jeong et al. | |
| 8,698,293 B2 | 4/2014 | Otremba et al. | |
| 8,704,359 B2 | 4/2014 | Tuominen et al. | |
| 8,710,402 B2 | 4/2014 | Lei et al. | |
| 8,710,649 B1 | 4/2014 | Huemoeller et al. | |
| 8,728,341 B2 | 5/2014 | Ryuzaki et al. | |
| 8,772,087 B2 | 7/2014 | Barth et al. | |
| 8,786,098 B2 | 7/2014 | Wang | |
| 8,877,554 B2 | 11/2014 | Tsai et al. | |
| 8,890,628 B2 | 11/2014 | Nair et al. | |
| 8,907,471 B2 | 12/2014 | Beyne et al. | |
| 8,921,995 B1 | 12/2014 | Railkar et al. | |
| 8,952,544 B2 | 2/2015 | Lin et al. | |
| 8,980,691 B2 | 3/2015 | Lin | |
| 8,990,754 B2 | 3/2015 | Bird et al. | |
| 8,994,185 B2 | 3/2015 | Lin et al. | |
| 8,999,759 B2 | 4/2015 | Chia | |
| 9,059,186 B2 | 6/2015 | Shim et al. | |
| 9,064,936 B2 | 6/2015 | Lin et al. | |
| 9,070,637 B2 | 6/2015 | Yoda et al. | |
| 9,099,313 B2 | 8/2015 | Lee et al. | |
| 9,111,914 B2 | 8/2015 | Lin et al. | |
| 9,142,487 B2 | 9/2015 | Toh et al. | |
| 9,159,678 B2 | 10/2015 | Cheng et al. | |
| 9,161,453 B2 | 10/2015 | Koyanagi | |
| 9,210,809 B2 | 12/2015 | Mallik et al. | |
| 9,224,674 B2 | 12/2015 | Malatkar et al. | |
| 9,275,934 B2 | 3/2016 | Sundaram et al. | |
| 9,318,376 B1 | 4/2016 | Holm et al. | |
| 9,355,881 B2 | 5/2016 | Goller et al. | |
| 9,363,898 B2 | 6/2016 | Tuominen et al. | |
| 9,396,999 B2 | 7/2016 | Yap et al. | |
| 9,406,645 B1 | 8/2016 | Huemoeller et al. | |
| 9,499,397 B2 | 11/2016 | Bowles et al. | |
| 9,530,752 B2 | 12/2016 | Nikitin et al. | |
| 9,554,469 B2 | 1/2017 | Hurwitz et al. | |
| 9,660,037 B1 | 5/2017 | Zechmann et al. | |
| 9,698,104 B2 | 7/2017 | Yap et al. | |
| 9,704,726 B2 | 7/2017 | Toh et al. | |
| 9,735,134 B2 | 8/2017 | Chen | |
| 9,748,167 B1 | 8/2017 | Lin | |
| 9,754,849 B2 | 9/2017 | Huang et al. | |
| 9,837,352 B2 | 12/2017 | Chang et al. | |
| 9,837,484 B2 | 12/2017 | Jung et al. | |
| 9,859,258 B2 | 1/2018 | Chen et al. | |
| 9,875,970 B2 | 1/2018 | Yi et al. | |
| 9,887,103 B2 | 2/2018 | Scanlan et al. | |
| 9,887,167 B1 | 2/2018 | Lee et al. | |

(56) References Cited

U.S. PATENT DOCUMENTS

| | | |
|---|---|---|
| 9,893,045 B2 | 2/2018 | Pagaila et al. |
| 9,978,720 B2 | 5/2018 | Theuss et al. |
| 9,997,444 B2 | 6/2018 | Meyer et al. |
| 10,014,292 B2 | 7/2018 | Or-Bach et al. |
| 10,037,975 B2 | 7/2018 | Hsieh et al. |
| 10,053,359 B2 | 8/2018 | Bowles et al. |
| 10,090,284 B2 | 10/2018 | Chen et al. |
| 10,109,588 B2 | 10/2018 | Jeong et al. |
| 10,128,177 B2 | 11/2018 | Kamgaing et al. |
| 10,153,219 B2 | 12/2018 | Jeon et al. |
| 10,163,803 B1 | 12/2018 | Chen et al. |
| 10,170,386 B2 | 1/2019 | Kang et al. |
| 10,177,083 B2 | 1/2019 | Kim et al. |
| 10,211,072 B2 | 2/2019 | Chen et al. |
| 10,229,827 B2 | 3/2019 | Chen et al. |
| 10,256,180 B2 | 4/2019 | Liu et al. |
| 10,269,773 B1 | 4/2019 | Yu et al. |
| 10,297,518 B2 | 5/2019 | Lin et al. |
| 10,297,586 B2 | 5/2019 | Or-Bach et al. |
| 10,304,765 B2 | 5/2019 | Chen et al. |
| 10,347,585 B2 | 7/2019 | Shin et al. |
| 10,410,971 B2 | 9/2019 | Rae et al. |
| 10,424,530 B1 | 9/2019 | Alur et al. |
| 10,515,912 B2 | 12/2019 | Lim et al. |
| 10,522,483 B2 | 12/2019 | Shuto |
| 10,553,515 B2 | 2/2020 | Chew |
| 10,570,257 B2 | 2/2020 | Sun et al. |
| 10,658,337 B2 | 5/2020 | Yu et al. |
| 2001/0020548 A1 | 9/2001 | Burgess |
| 2001/0030059 A1 | 10/2001 | Sugaya et al. |
| 2002/0036054 A1 | 3/2002 | Nakatani et al. |
| 2002/0048715 A1 | 4/2002 | Walczynski |
| 2002/0070443 A1 | 6/2002 | Mu et al. |
| 2002/0074615 A1 | 6/2002 | Honda |
| 2002/0135058 A1 | 9/2002 | Asahi et al. |
| 2002/0158334 A1 | 10/2002 | Vu et al. |
| 2002/0170891 A1 | 11/2002 | Boyle et al. |
| 2003/0059976 A1 | 3/2003 | Nathan et al. |
| 2003/0221864 A1 | 12/2003 | Bergstedt et al. |
| 2003/0222330 A1 | 12/2003 | Sun et al. |
| 2004/0080040 A1 | 4/2004 | Dotta et al. |
| 2004/0118824 A1 | 6/2004 | Burgess |
| 2004/0134682 A1 | 7/2004 | En et al. |
| 2004/0248412 A1 | 12/2004 | Liu et al. |
| 2005/0012217 A1 | 1/2005 | Mori et al. |
| 2005/0170292 A1 | 8/2005 | Tsai et al. |
| 2006/0014532 A1 | 1/2006 | Seligmann et al. |
| 2006/0073234 A1 | 4/2006 | Williams |
| 2006/0128069 A1 | 6/2006 | Hsu |
| 2006/0145328 A1 | 7/2006 | Hsu |
| 2006/0160332 A1 | 7/2006 | Gu et al. |
| 2006/0270242 A1 | 11/2006 | Verhaverbeke et al. |
| 2006/0283716 A1 | 12/2006 | Hafezi et al. |
| 2007/0035033 A1 | 2/2007 | Ozguz et al. |
| 2007/0042563 A1 | 2/2007 | Wang et al. |
| 2007/0077865 A1 | 4/2007 | Dysard et al. |
| 2007/0111401 A1 | 5/2007 | Kataoka et al. |
| 2007/0130761 A1 | 6/2007 | Kang et al. |
| 2008/0006945 A1 | 1/2008 | Lin et al. |
| 2008/0011852 A1 | 1/2008 | Gu et al. |
| 2008/0090095 A1 | 4/2008 | Nagata et al. |
| 2008/0113283 A1 | 5/2008 | Ghoshal et al. |
| 2008/0119041 A1 | 5/2008 | Magera et al. |
| 2008/0173792 A1 | 7/2008 | Yang et al. |
| 2008/0173999 A1 | 7/2008 | Chung et al. |
| 2008/0296273 A1 | 12/2008 | Lei et al. |
| 2009/0084596 A1 | 4/2009 | Inoue et al. |
| 2009/0243065 A1 | 10/2009 | Sugino et al. |
| 2009/0250823 A1 | 10/2009 | Racz et al. |
| 2009/0278126 A1 | 11/2009 | Yang et al. |
| 2010/0013081 A1 | 1/2010 | Toh et al. |
| 2010/0062287 A1 | 3/2010 | Beresford et al. |
| 2010/0144101 A1 | 6/2010 | Chow et al. |
| 2010/0148305 A1 | 6/2010 | Yun |
| 2010/0160170 A1 | 6/2010 | Horimoto et al. |
| 2010/0248451 A1* | 9/2010 | Pirogovsky ............ B23K 26/38 257/E21.599 |
| 2010/0264538 A1 | 10/2010 | Swinnen et al. |
| 2010/0301023 A1 | 12/2010 | Unrath et al. |
| 2010/0307798 A1 | 12/2010 | Izadian |
| 2011/0062594 A1 | 3/2011 | Maekawa et al. |
| 2011/0097432 A1 | 4/2011 | Yu et al. |
| 2011/0111300 A1 | 5/2011 | DelHagen et al. |
| 2011/0204505 A1 | 8/2011 | Pagaila et al. |
| 2011/0259631 A1* | 10/2011 | Rumsby ............... B23K 26/066 219/121.7 |
| 2011/0291293 A1 | 12/2011 | Tuominen et al. |
| 2011/0304024 A1 | 12/2011 | Renna |
| 2011/0316147 A1 | 12/2011 | Shih et al. |
| 2012/0128891 A1 | 5/2012 | Takei et al. |
| 2012/0146209 A1 | 6/2012 | Hu et al. |
| 2012/0164827 A1 | 6/2012 | Rajagopalan et al. |
| 2012/0261805 A1 | 10/2012 | Sundaram et al. |
| 2013/0074332 A1 | 3/2013 | Suzuki |
| 2013/0105329 A1 | 5/2013 | Matejat et al. |
| 2013/0196501 A1 | 8/2013 | Sulfridge |
| 2013/0203190 A1 | 8/2013 | Reed et al. |
| 2013/0286615 A1 | 10/2013 | Inagaki et al. |
| 2013/0341738 A1 | 12/2013 | Reinmuth et al. |
| 2014/0054075 A1 | 2/2014 | Hu |
| 2014/0092519 A1 | 4/2014 | Yang |
| 2014/0094094 A1 | 4/2014 | Rizzuto et al. |
| 2014/0103499 A1 | 4/2014 | Andry et al. |
| 2014/0252655 A1 | 9/2014 | Tran et al. |
| 2014/0353019 A1 | 12/2014 | Arora et al. |
| 2015/0228416 A1 | 8/2015 | Hurwitz et al. |
| 2015/0296610 A1 | 10/2015 | Daghighian et al. |
| 2015/0311093 A1 | 10/2015 | Li et al. |
| 2015/0359098 A1 | 12/2015 | Ock |
| 2015/0380356 A1 | 12/2015 | Chauhan et al. |
| 2016/0013135 A1 | 1/2016 | He et al. |
| 2016/0020163 A1 | 1/2016 | Shimizu et al. |
| 2016/0049371 A1 | 2/2016 | Lee et al. |
| 2016/0088729 A1 | 3/2016 | Kobuke et al. |
| 2016/0095203 A1 | 3/2016 | Min et al. |
| 2016/0118337 A1 | 4/2016 | Yoon et al. |
| 2016/0270242 A1 | 9/2016 | Kim et al. |
| 2016/0276325 A1 | 9/2016 | Nair et al. |
| 2016/0329299 A1 | 11/2016 | Lin et al. |
| 2016/0336296 A1 | 11/2016 | Jeong et al. |
| 2017/0047308 A1 | 2/2017 | Ho et al. |
| 2017/0064835 A1 | 3/2017 | Ishihara et al. |
| 2017/0223842 A1 | 8/2017 | Chujo et al. |
| 2017/0229432 A1 | 8/2017 | Lin et al. |
| 2017/0338254 A1 | 11/2017 | Reit et al. |
| 2018/0019197 A1 | 1/2018 | Boyapati et al. |
| 2018/0116057 A1 | 4/2018 | Kajihara et al. |
| 2018/0182727 A1 | 6/2018 | Yu |
| 2018/0197831 A1 | 7/2018 | Kim et al. |
| 2018/0204802 A1 | 7/2018 | Lin et al. |
| 2018/0308792 A1 | 10/2018 | Raghunathan et al. |
| 2018/0352658 A1 | 12/2018 | Yang |
| 2018/0374696 A1 | 12/2018 | Chen et al. |
| 2018/0376589 A1 | 12/2018 | Harazono |
| 2019/0088603 A1 | 3/2019 | Marimuthu et al. |
| 2019/0131224 A1 | 5/2019 | Choi et al. |
| 2019/0131270 A1 | 5/2019 | Lee et al. |
| 2019/0131284 A1 | 5/2019 | Jeng et al. |
| 2019/0189561 A1 | 6/2019 | Rusli |
| 2019/0229046 A1 | 7/2019 | Tsai et al. |
| 2019/0237430 A1 | 8/2019 | England |
| 2019/0285981 A1 | 9/2019 | Cunningham et al. |
| 2019/0306988 A1 | 10/2019 | Grober et al. |
| 2019/0355680 A1 | 11/2019 | Chuang et al. |
| 2019/0369321 A1 | 12/2019 | Young et al. |
| 2020/0003936 A1 | 1/2020 | Fu et al. |
| 2020/0039002 A1 | 2/2020 | Sercel et al. |
| 2020/0130131 A1 | 4/2020 | Togawa et al. |

(56) References Cited

U.S. PATENT DOCUMENTS

| | | |
|---|---|---|
| 2020/0357947 A1 | 11/2020 | Chen et al. |
| 2020/0358163 A1 | 11/2020 | See et al. |

FOREIGN PATENT DOCUMENTS

| | | |
|---|---|---|
| CN | 100463128 C | 2/2009 |
| CN | 100502040 C | 6/2009 |
| CN | 100524717 C | 8/2009 |
| CN | 100561696 C | 11/2009 |
| CN | 104637912 A | 5/2015 |
| CN | 105436718 A | 3/2016 |
| CN | 106531647 A | 3/2017 |
| CN | 106653703 A | 5/2017 |
| CN | 108028225 A | 5/2018 |
| CN | 111492472 A | 8/2020 |
| EP | 0264134 A2 | 4/1988 |
| EP | 1536673 A1 | 6/2005 |
| EP | 1478021 B1 | 7/2008 |
| EP | 1845762 B1 | 5/2011 |
| EP | 2942808 A1 | 11/2015 |
| JP | 2001244591 A | 9/2001 |
| JP | 2002246755 A | 8/2002 |
| JP | 2003188340 A | 7/2003 |
| JP | 2004311788 A | 11/2004 |
| JP | 2004335641 A | 11/2004 |
| JP | 4108285 B2 | 6/2008 |
| JP | 2012069926 A | 4/2012 |
| JP | 5004378 B2 | 8/2012 |
| JP | 5111342 B2 | 1/2013 |
| JP | 5693977 B2 | 4/2015 |
| JP | 5700241 B2 | 4/2015 |
| JP | 5981232 B2 | 8/2016 |
| JP | 6394136 B2 | 9/2018 |
| JP | 6542616 B2 | 7/2019 |
| JP | 6626697 B2 | 12/2019 |
| KR | 100714196 B1 | 5/2007 |
| KR | 100731112 B1 | 6/2007 |
| KR | 10-2008-0037296 A | 4/2008 |
| KR | 2008052491 A | 6/2008 |
| KR | 20100097893 A | 9/2010 |
| KR | 101301507 B1 | 9/2013 |
| KR | 20140086375 A | 7/2014 |
| KR | 101494413 B1 | 2/2015 |
| KR | 20160013706 A | 2/2016 |
| KR | 20180113885 A | 10/2018 |
| KR | 101922884 B1 | 11/2018 |
| KR | 101975302 B1 | 8/2019 |
| KR | 102012443 B1 | 8/2019 |
| TW | I594397 B | 8/2017 |
| WO | 2011130300 A1 | 10/2011 |
| WO | 2013008415 A1 | 1/2013 |
| WO | 2013126927 A2 | 8/2013 |
| WO | 2015126438 A1 | 8/2015 |
| WO | 2017111957 A1 | 6/2017 |
| WO | 2018013122 A1 | 1/2018 |
| WO | 2018125184 A1 | 7/2018 |
| WO | 2019023213 A1 | 1/2019 |
| WO | 2019066988 A1 | 4/2019 |
| WO | 2019/177742 A1 | 9/2019 |

OTHER PUBLICATIONS

PCT International Search Report and Written Opinion dated Feb. 19, 2021, for International Application No. PCT/US2020/057788.
U.S. Office Action dated May 13, 2021, in U.S. Appl. No. 16/870,843.
Shen, Qiao—"Modeling, Design and Demonstration of Through-Package-Vias in Panel-Based Polycrystalline Silicon Interposers for High Performance, High Reliability and Low Cost," a Dissertation presented to the Academic Faculty, Georgia Institute of Technology, May 2015, 168 pages.
Lannon, John Jr., et al.—"Fabrication and Testing of a TSV-Enabled Si Interposer with Cu- and Polymer-Based Multilevel Metallization," IEEE Transactions on Components, Packaging and Manufacturing Technology, vol. 4, No. 1, Jan. 2014, pp. 153-157.
Malta, D., et al.—"Fabrication of TSV-Based Silicon Interposers," 3D Systems Integration Conference (3DIC), 2010 IEEE International, Nov. 16-18, 2010, 6 pages.
Allresist Gmbh—Strausberg et al: "Resist-Wiki: Adhesion promoter HMDS and diphenylsilanedio (AR 300-80)—. . . -ALLRESIST GmbH—Strausberg, Germany", Apr. 12, 2019 (Apr. 12, 2019), XP055663206, Retrieved from the Internet: URL:https://web.archive.org/web/2019041220micals-adhesion-promoter-hmds-and-diphenyl2908/https://www.allresist.com/process-chemicals-adhesion-promoter-hmds-and-diphenylsilanedio/, [retrieved on Jan. 29, 2020].
Amit Kelkar, et al. "Novel Mold-free Fan-out Wafer Level Package using Silicon Wafer", IMAPS 2016—49th International Symposium on Microelectronics—Pasadena, CA USA—Oct. 10-13, 2016, 5 pages. (IMAPS 2016—49th International Symposium on Microelectronics—Pasadena, CA USA—Oct. 10-13, 2016, 5 pages.).
Arifur Rahman. "System-Level Performance Evaluation of Three-Dimensional Integrated Circuits", vol. 8, No. 6, Dec. 2000. pp. 671-678.
Chien-Wei Chien et al "Chip Embedded Wafer Level Packaging Technology for Stacked RF-SiP Application",2007 IEEE, pp. 305-310.
Chien-Wei Chien et al. "3D Chip Stack With Wafer Through Hole Technology". 6 pages.
Doany, F.E., et al.—"Laser release process to obtain freestanding multilayer metal-poly imide circuits," IBM Journal of Research and Development, vol. 41, Issue 1/2, Jan./Mar. 1997, pp. 151-157.
Dyer, P.E., et al.—"Nanosecond photoacoustic studies on ultraviolet laser ablation of organic polymers," Applied Physics Letters, vol. 48, No. 6, Feb. 10, 1986, pp. 445-447.
Han et al.—"Process Feasibility and Reliability Performance of Fine Pitch Si Bare Chip Embedded in Through Cavity of Substrate Core," IEEE Trans. Components, Packaging and Manuf. Tech., vol. 5, No. 4, pp. 551-561, 2015. [Han et al. IEEE Trans. Components, Packaging and Manuf. Tech., vol. 5, No. 4, pp. 551-561, 2015.].
Han et al.—"Through Cavity Core Device Embedded Substrate for Ultra-Fine-Pitch Si Bare Chips; (Fabrication feasibility and residual stress evaluation)", ICEP-IAAC, 2015, pp. 174-179. [Han et al., ICEP-IAAC, 2015, pp. 174-179.].
Han, Younggun, et al.—"Evaluation of Residual Stress and Warpage of Device Embedded Substrates with Piezo-Resistive Sensor Silicon Chips" technical paper, Jul. 31, 2015, pp. 81-94.
International Search Report and the Written Opinion for International Application No. PCT/US2019/064280 dated Mar. 20, 2020, 12 pages.
International Search Report and Written Opinion for Application No. PCT/US2020/026832 dated Jul. 23, 2020.
Italian search report and written opinion for Application No. IT 201900006736 dated Mar. 2, 2020.
Italian Search Report and Written Opinion for Application No. IT 201900006740 dated Mar. 4, 2020.
Junghoon Yeom', et al. "Critical Aspect Ratio Dependence in Deep Reactive Ion Etching of Silicon", 2003 IEEE. pp. 1631-1634.
K. Sakuma et al. "3D Stacking Technology with Low-Volume Lead-Free Interconnections", IBM T.J. Watson Research Center. 2007 IEEE, pp. 627-632.
Kenji Takahashi et al. "Current Status of Research and Development for Three-Dimensional Chip Stack Technology", Jpn. J. Appl. Phys. vol. 40 (2001) pp. 3032-3037, Part 1, No. 4B, Apr. 2001. 6 pages.
Kim et al. "A Study on the Adhesion Properties of Reactive Sputtered Molybdenum Thin Films with Nitrogen Gas on Polyimide Substrate as a Cu Barrier Layer," 2015, Journal of Nanoscience and Nanotechnology, vol. 15, No. 11, pp. 8743-8748, doi: 10.1166/jnn.2015.11493.
Knickerbocker, J.U., et al.—"Development of next-generation system-on-package (SOP) technology based on silicon carriers with fine-pitch chip interconnection," IBM Journal of Research and Development, vol. 49, Issue 4/5, Jul./Sep. 2005, pp. 725-753.
Knickerbocker, John U., et al.—"3-D Silicon Integration and Silicon Packaging Technology Using Silicon Through-Vias," IEEE Journal of Solid-State Circuits, vol. 41, No. 8, Aug. 2006, pp. 1718-1725.

(56) References Cited

OTHER PUBLICATIONS

L. Wang, et al. "High aspect ratio through-wafer interconnections for 3Dmicrosystems", 2003 IEEE. pp. 634-637.
Lee et al. "Effect of sputtering parameters on the adhesion force of copper/molybdenum metal on polymer substrate," 2011, Current Applied Physics, vol. 11, pp. S12-S15, doi: 10.1016/j.cap.2011.06.019.
Narayan, C., et al.—"Thin Film Transfer Process for Low Cost MCM's," Proceedings of 1993 IEEE/CHMT International Electronic Manufacturing Technology Symposium, Oct. 4-6, 1993, pp. 373-380.
NT Nguyen et al. "Through-Wafer Copper Electroplating for Three-Dimensional Interconnects", Journal of Micromechanics and Microengineering. 12 (2002) 395-399. 2002 IOP.
PCT International Search Report and Written Opinion dated Aug. 28, 2020, for International Application No. PCT/US2020/032245.
PCT International Search Report and Written Opinion dated Sep. 15, 2020, for International Application No. PCT/US2020/035778.
Ronald Hon et al. "Multi-Stack Flip Chip 3D Packaging with Copper Plated Through-Silicon Vertical Interconnection", 2005 IEEE pp. 384-389.
S. W. Ricky Lee et al. "3D Stacked Flip Chip Packaging with Through Silicon Vias and Copper Plating or Conductive Adhesive Filling", 2005 IEEE, pp. 798-801.
Shen, Li-Cheng, et al.—"A Clamped Through Silicon via (TSV) Interconnection for Stacked Chip Bonding Using Metal Cap on Pad and Metal Column Forming in via," Proceedings of 2008 Electronic Components and Technology Conference, pp. 544-549.
Shi, Tailong, et al.—"First Demonstration of Panel Glass Fan-out (GFO) Packages for High I/O Density and High Frequency Multichip Integration," Proceedings of 2017 IEEE 67th Electronic Components and Technology Conference, May 30-Jun. 2, 2017, pp. 41-46.
Srinivasan, R., et al.—"Ultraviolet Laser Ablation of Organic Polymers," Chemical Reviews, 1989, vol. 89, No. 6, pp. 1303-1316.
Taiwan Office Action dated Oct. 27, 2020 for Application No. 108148588.
Wu et al., Microelect. Eng., vol. 87 2010, pp. 505-509.
Yu et al. "High Performance, High Density RDL for Advanced Packaging," 2018 IEEE 68th Electronic Components and Technology Conference, pp. 587-593, DOI 10.1109/ETCC.2018.0009.
Yu, Daquan—"Embedded Silicon Fan-out (eSiFO) Technology for Wafer-Level System Integration," Advances in Embedded and Fan-Out Wafer-Level Packaging Technologies, First Edition, edited by Beth Keser and Steffen Kroehnert, published 2019 by John Wiley & Sons, Inc., pp. 169-184.
Tecnisco, Ltd.—"Company Profile" presentation with product introduction, date unknown, 26 pages.
Wang et al. "Study of Direct Cu Electrodeposition on Ultra-Thin Mo for Copper Interconnect", State key lab of ASIC and system, School of microelectronics, Fudan University, Shanghai, China; 36 pages.
International Search Report and Written Opinion dated Oct. 7, 2021 for Application No. PCT/US2021037375.
PCT International Search Report and Written Opinion dated Oct. 19, 2021, for International Application No. PCT/US2021/038690.
Trusheim, D. et al., Investigation of the Influence of Pulse Duration in Laser Processes for Solar Cells, Physics Procedia Dec. 2011, 278-285, 9 pages.
Knorz, A. et al., High Speed Laser Drilling: Parameter Evaluation and Characterisation, Presented at the 25th European PV Solar Energy Conference and Exhibition, Sep. 6-10, 2010, Valencia, Spain, 7 pages.
Baier, T. et al., Theoretical Approach to Estimate Laser Process Parameters for Drilling in Crystalline Silicon, Prog. Photovolt: Res. Appl. 18 (2010) 603-606, 5 pages.
Liu, C.Y. et al., Time Resolved Shadowgraph Images of Silicon during Laser Ablation: Shockwaves and Particle Generation, Journal of Physics: Conference Series 59 (2007) 338-342, 6 pages.
PCT International Search Report and Written Opinion dated Feb. 4, 2022, for International Application No. PCT/US2021/053830.
PCT International Search Report and Written Opinion dated Feb. 4, 2022, for International Application No. PCT/US2021/053821.

* cited by examiner

LASER ABLATION FOR PACKAGE FABRICATION

FIELD

Embodiments of the present disclosure generally relate to a method of fabricating semiconductor packages, and more specifically, to a method of forming features on a substrate by laser ablation.

BACKGROUND

Due to a continual goal of semiconductor manufacturers to increase yield and enhance performance of electronic devices and components, efforts to increase the density of semiconductor devices fabricated on a given size of a semiconductor substrate have been intensified. One method for increasing the density of semiconductor devices in a semiconductor assembly is to stack semiconductor dies to create a three-dimensional multichip module (3-D MCM). The formation of a 3-D MCM typically requires creating vias (i.e., through holes) in at least one semiconductor die that extend from its active surface to the opposing back surface thereof. The vias are filled with an electrically conductive material that provides interconnection of the back surface of the semiconductor die to external electrical contacts of another semiconductor die or a carrier substrate of the 3-D MCM.

Conventionally, etching and laser ablation or drilling are two methods frequently used for forming vias in semiconductor substrates. While forming vias using laser drilling has the advantage of being significantly faster and more locationally and dimensionally accurate than forming vias by etching, precise control of depth and topography of drilled areas have not yet been achieved by laser drilling. Furthermore, the laser energy is often used inefficiently, thus, leading to low ablation rates.

Accordingly, there is a need for a laser drilling method of rapidly forming vias in semiconductor substrates with controlled depth and topography.

SUMMARY

In one embodiment, a method of fabricating a frame to enclose one or more semiconductor dies includes forming one or more features including one or more cavities and one or more through-vias in a substrate by a first laser ablation process, filling the one or more through-vias with a dielectric material, and forming a via-in-via in the dielectric material filled in each of the one or more through-vias by a second laser ablation process. The one or more cavities is configured to enclose one or more semiconductor dies therein. The one or more through-vias extending through the substrate. In the first laser ablation process, frequency, pulse width, and pulse energy of a first pulsed laser beam to irradiate the substrate are tuned based on a depth of the one or more features. In the second laser ablation process, frequency, pulse width, and pulse energy of a second pulsed laser beam to irradiate the dielectric material are tuned based on a depth of the via-in-via.

In another embodiment, a method of patterning a substrate includes forming one or more features in a substrate by irradiating the substrate with a pulsed laser beam, and tuning frequency, pulse width, and pulse energy of the pulsed laser beam based on a depth of the one or more features.

In another embodiment, a method of fabricating a die assembly includes forming a frame, disposing one or more semiconductor dies within the one or more cavities, and disposing an interconnection within the via-in-via. The forming a frame includes forming one or more features, including one or more cavities and one or more through-vias in a substrate by a first laser ablation process, filling the one or more through-vias with a dielectric material; and forming a via-in-via in the dielectric material filled in each of the one or more through-vias by a second laser ablation process. The one or more through-vias extends through the substrate. In the first laser ablation process, frequency, pulse width, and pulse energy of a first pulsed laser beam to irradiate the substrate are tuned based on a depth of the one or more features. In the second laser ablation process, frequency, pulse width, and pulse energy of a second pulsed laser beam to irradiate the dielectric material are tuned based on a depth of the via-in-via.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure relates to methods for forming a semiconductor package. In one embodiment, a substrate is patterned, by laser ablation to enable formation of interconnections therethrough. The substrate is thereafter utilized as a package frame for forming one or more semiconductor packages with semiconductor dies disposed therein. The methods disclosed herein include tuning of pulsed laser beams used for forming features in a substrate. Specifically, frequency, pulse width, and pulse energy of pulsed laser beams are tuned based on sizes of the features and the material in which the features are formed. The appropriate tuning of pulsed laser beams used for laser beams allows rapid formation of features in semiconductor substrates with controlled depth and topography.

As used herein, the term "about" refers to a +/−10% variation from the nominal value. It is to be understood that such a variation can be included in any value provided herein.

Figure 1A:
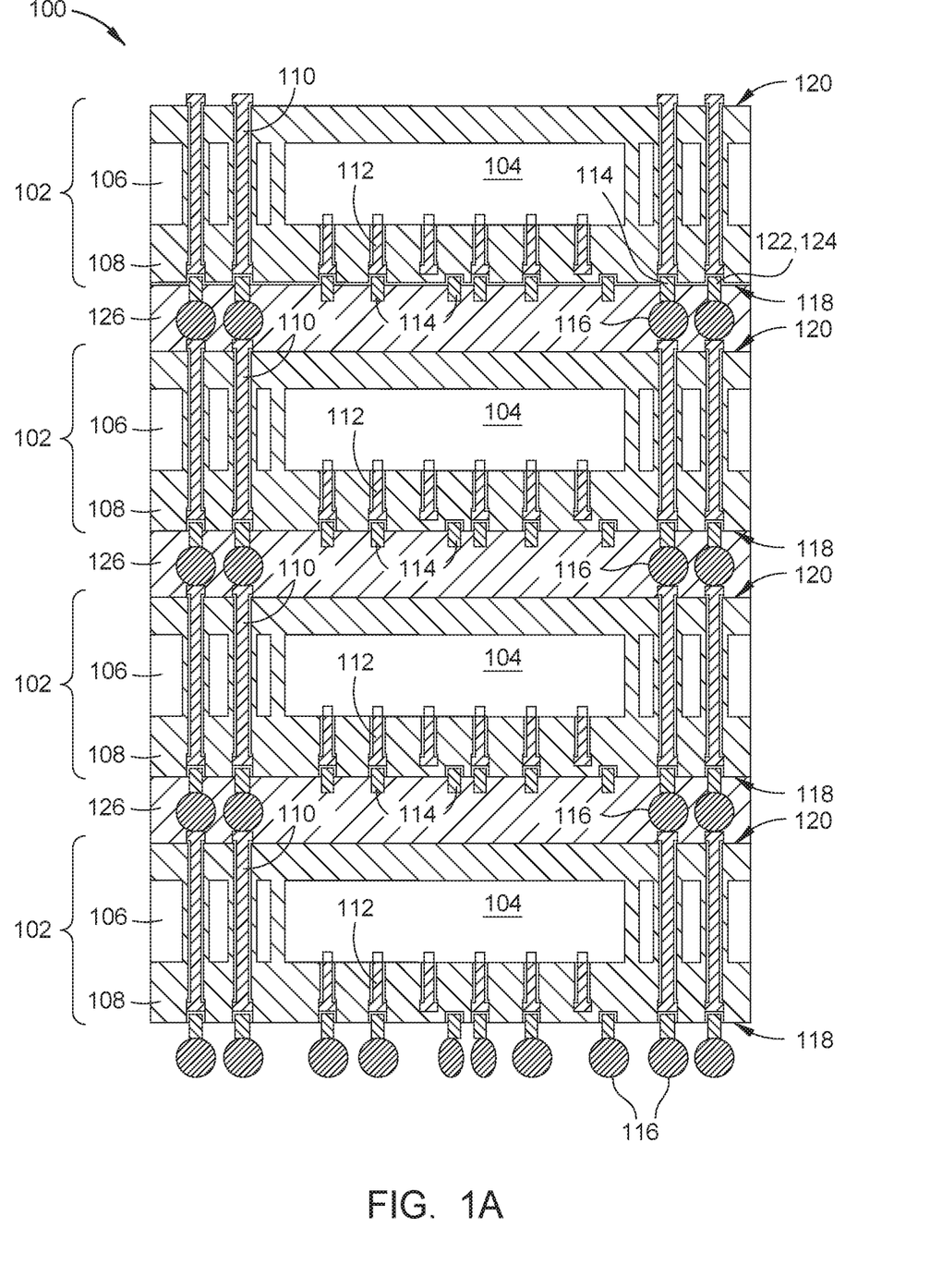
FIG. 1A illustrates a three-dimensional multichip module (3-D MCM) according to one embodiment.

FIG. 1A illustrates one exemplary embodiment of a three-dimensional multichip module (3-D MCM) 100 that is formed of four semiconductor packages 102. Each semiconductor package 102 includes a semiconductor die 104 (i.e., memory chip) embedded within a substrate 106 and encapsulated by an insulating layer 108 (e.g., having a portion of each side in contact with the insulating layer 108). In some embodiments, the insulating layer 108 is formed by curing a ceramic-filler-containing epoxy resin, such as an epoxy resin containing silica ($SiO_2$) particles. Other examples of ceramic fillers that may be utilized to form the insulating layer 108 include aluminum nitride (AlN), aluminum oxide ($Al_2O_3$), silicon carbide (SiC), silicon nitride ($Si_3N_4$), $Sr_2Ce_2Ti_5O_{16}$, zirconium silicate ($ZrSiO_4$), wollastonite ($CaSiO_3$), beryllium oxide (BeO), cerium dioxide ($CeO_2$), boron nitride (BN), calcium copper titanium oxide ($CaCu_3Ti_4O_{12}$), magnesium oxide (MgO), titanium dioxide ($TiO_2$), zinc oxide (ZnO) and the like. In some examples, the ceramic fillers utilized to form the insulating layer 108 have particles ranging in size between about 40 nm and about 1.5 µm, such as between about 80 nm and about 1 µm, and between about 300 nm and about 600 nm. In some embodiments, the ceramic fillers utilized to form the insulating layer 108 include particles having a size less than about 25% of the desired feature (e.g., via, cavity, or through-assembly via) width or diameter, such as less than about 15% of the desired feature width or diameter. One or more interconnections 110 are formed though the entire thickness of each semiconductor package 102. One or more interconnections 112 are formed through the insulating layer 108. In some embodiments, one or more redistribution connections 114 are formed in the semiconductor package 102 to relocate contact points of the interconnections to desired lateral locations on the surface of the semiconductor package 102.

The interconnections 110 are in contact with one or more solder bumps 116 disposed between major surfaces 118 and 120 of adjacent the semiconductor packages directly, or via the redistribution connections 114 or an optional adhesion layer 122 and/or seed layer 124 formed on the insulating layer 108. The redistribution connections 114 are formed by any suitable methods including electroplating and electroless deposition. In some embodiments, the adhesion layer 122 is formed from titanium, titanium nitride, tantalum, tantalum nitride, manganese, manganese oxide, molybdenum, cobalt oxide, cobalt nitride, or any other suitable materials or combinations thereof. In some embodiments, the adhesion layer 122 has a thickness of between about 10 nm and about 300 nm, such as between about 50 nm and about 150 nm. For example, the adhesion layer 122 has a thickness between about 75 nm and about 125 nm, such as about 100 nm. The adhesion layer 122 may be formed by any suitable deposition process, including but not limited to CVD, PVD, PECVD, ALD, or the like. The seed layer 124 is formed of a conductive material such as copper, tungsten, aluminum, silver, gold, or any other suitable materials or combinations thereof. In some embodiments, the seed layer 124 has a thickness between about 50 nm and about 500 nm, such as between about 100 nm and about 300 nm. For example, the seed layer 124 has a thickness between about 150 nm and about 250 nm, such as about 200 nm. In some embodiments, the seed layer 124 has a thickness of between about 0.1 µm and about 1.5 µm. Similar to the adhesion layer 122, the seed layer 124 is formed by any suitable deposition process, such as CVD, PVD, PECVD, ALD dry processes, wet electroless plating processes, or the like. In some embodiments, a molybdenum adhesion layer 122 is formed on the semiconductor die 104 in combination with a copper seed layer 124.

As depicted in the 3-D MCM 100, four or more solder bumps 116 are disposed between major surfaces 118 and 120 of adjacent semiconductor packages 102 to bridge (e.g., connect, couple) the interconnections 110 of each semiconductor package 102 with the interconnections 110 of an adjacent semiconductor package 102.

In some embodiments, voids between adjacent semiconductor packages 102 connected by the solder bumps 116 are filled with an encapsulation material 126 to enhance the reliability of the solder bumps 116. The encapsulation material 126 may be any suitable type of encapsulant or underfill. In one example, the encapsulation material 126 includes a pre-assembly underfill material, such as a no-flow underfill (NUF) material, a nonconductive paste (NCP) material, and a nonconductive film (NCF) material. In one example, the encapsulation material 126 includes a post-assembly underfill material, such as a capillary underfill (CUF) material and a molded underfill (MUF) material. In one embodiment, the encapsulation material 126 includes a low-expansion-filler-containing resin, such as an epoxy resin filled with (e.g., containing) $SiO_2$, AlN, $Al_2O_3$, SiC, $Si_3N_4$, $Sr_2Ce_2Ti_5O_{16}$, $ZrSiO_4$, $CaSiO_3$, BeO, $CeO_2$, BN, $CaCu_3Ti_4O_{12}$, MgO, $TiO_2$, ZnO and the like.

In one embodiment, the solder bumps 116 are formed of one or more intermetallic compounds, such as a combination of tin (Sn) and lead (Pb), silver (Ag), Cu, or any other suitable metals thereof. For example, the solder bumps 116 are formed of a solder alloy such as Sn—Pb, Sn—Ag, Sn—Cu, or any other suitable materials or combinations thereof. In one embodiment, the solder bumps 116 include C4 (controlled collapse chip connection) bumps. In one embodiment, the solder bumps 116 include C2 (chip connection, such as a Cu-pillar with a solder cap) bumps. Utilization of C2 solder bumps enables a smaller pitch between contact pads and improved thermal and/or electrical properties for the 3-D MCM 100. In some embodiments, the solder bumps 116 have a diameter between about 10 µm and about 150 µm, such as a diameter between about 50 µm and about 100 µm. The solder bumps 116 may further be formed by any suitable wafer bumping processes, including but not limited to electrochemical deposition (ECD) and electroplating.

Figure 1B:
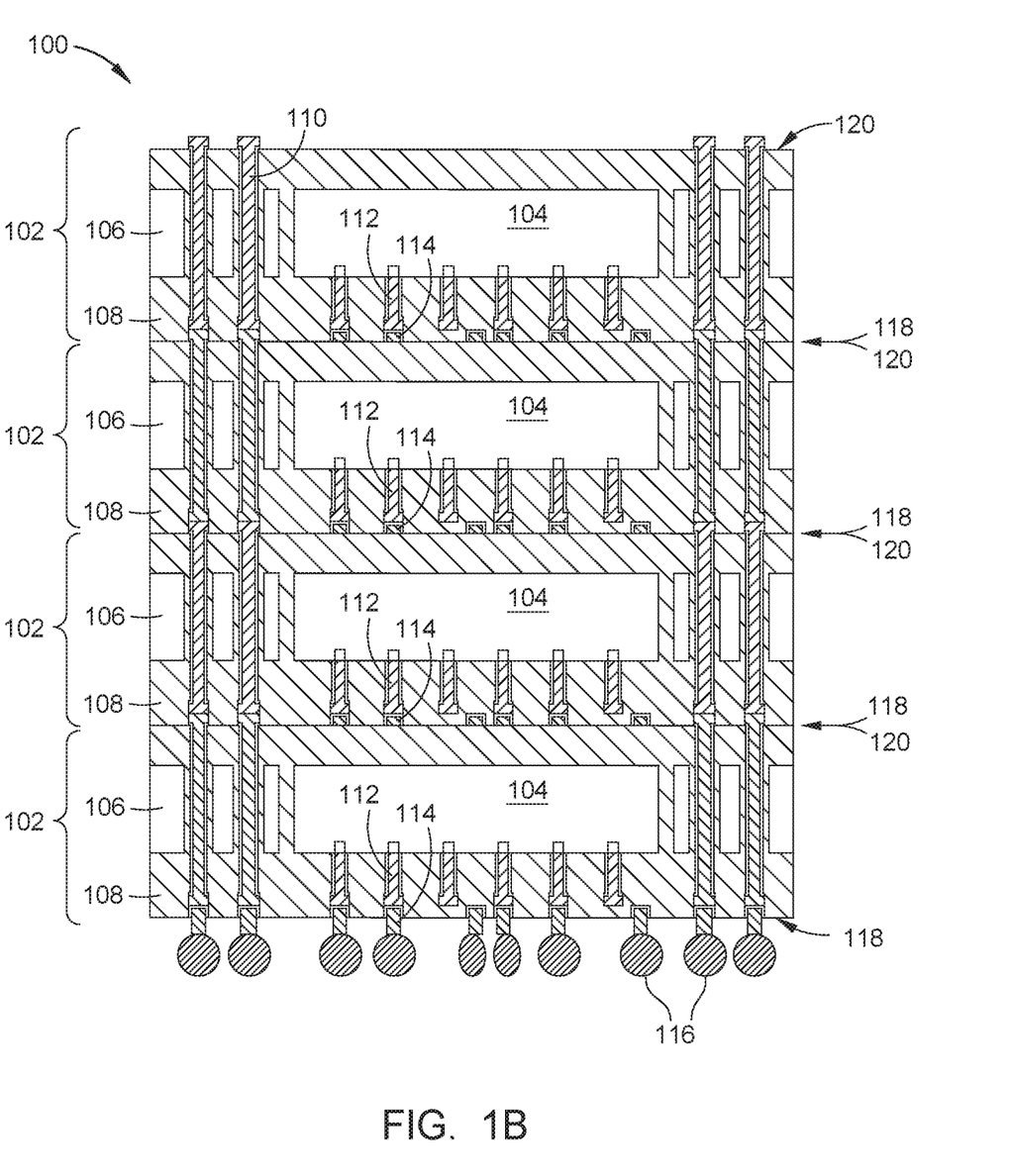
FIG. 1B illustrates a three-dimensional multichip module (3-D MCM) according to one embodiment.

FIG. 1B illustrates another exemplary embodiment of a three-dimensional multichip module (3-D MCM) 100 that is formed by stacking four semiconductor packages 102 and directly bonding one or more interconnections 110 of each semiconductor package 102 with the interconnections 110 of one or more adjacent semiconductor packages 102. As depicted, the semiconductor packages 102 may be bonded by hybrid bonding, in which major surfaces 118 and 120 of adjacent packages are planarized and in full contact with each other. Thus, one or more interconnections 110 of each semiconductor package 102 are formed through the entire thickness of each semiconductor package 102 and are in contact with one or more interconnections 112 of at least another adjacent semiconductor package 102.

Figure 2A:
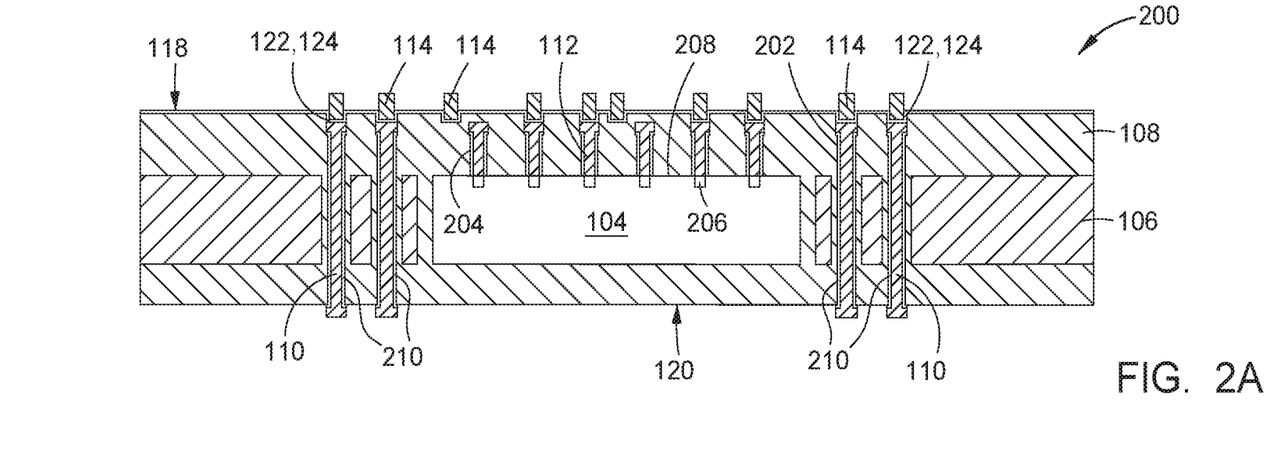
FIG. 2A illustrates a die assembly 200 according to one embodiment.
Figure 2B:
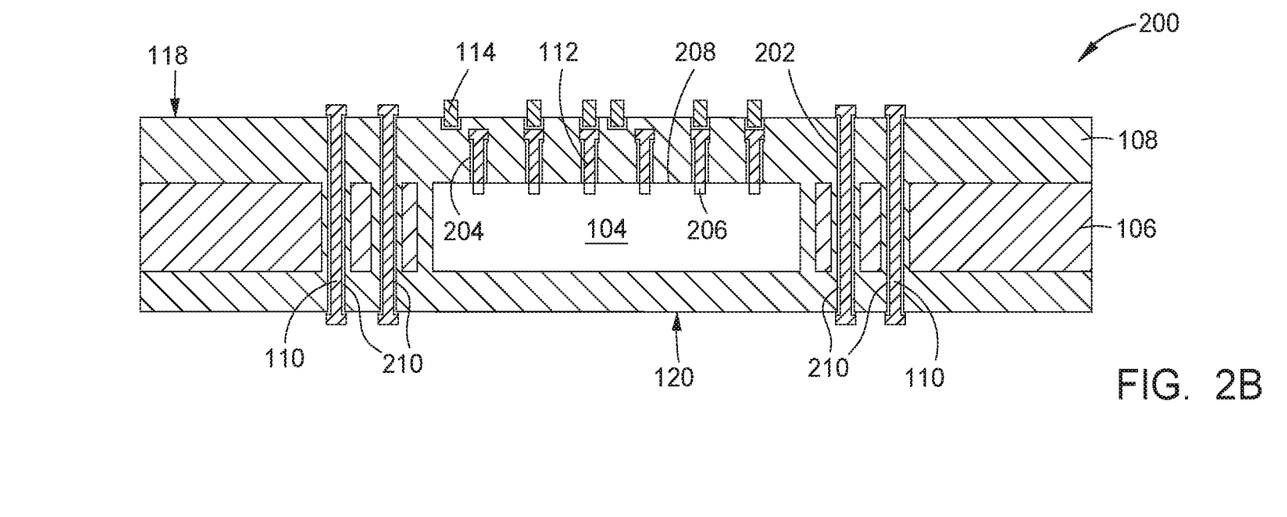
FIG. 2B illustrates a die assembly 200 according to one embodiment.

FIGS. 2A and 2B illustrate a die assembly 200 according to one embodiment. One or more semiconductor packages 102 described in relation to FIGS. 1A and 1B are formed by singulating (i.e., cutting or dicing) the die assembly 200 described herein in relation to FIGS. 2A and 2B, respectively.

The die assembly 200 includes one or more interconnections 110 formed through one or more through-assembly vias 202 that are drilled through the die assembly 200, forming channels through the entire thickness of the die assembly 200. In some embodiments, the through-assembly vias 202 have a diameter of between about 20 μm and about 70 μm, such as about 30 μm. The through-assembly vias 202 may be circumferentially laminated by a dielectric layer 210. The dielectric layer 210 may be an organic dielectric, such as Ajinomoto Build-up Film (ABF) and Mitsubishi BT Film and have a thickness of between about 20 μm and about 70 μm, such as such as about 30 μm. By having the dielectric layer 210 circumferentially surrounding the through-assembly vias 202, capacitive coupling between the conductive silicon-based substrate 106 and interconnections 110. Thus, capacitive coupling between adjacently positioned through-assembly via 202 and/or contact holes 204 in the through-assembly via 202 in FIG. 2A, and via 202, contact holes 204, and/or redistribution connections 114 in the die assembly 200 in FIG. 2B is formed.

The die assembly 200 further includes one or more interconnections 112 formed through one or more contact holes 204 drilled through the insulating layer 108 to expose one or more contacts 206 formed on the active surface 208 of each semiconductor die 104. The contact holes 204 are drilled through the insulating layer 108 by laser ablation, leaving all external surfaces of the semiconductor dies 104 covered and surrounded by the insulating layer 108 and the contacts 206 exposed. By having the ceramic-filler-containing epoxy resin material of the insulating layer 108 line the walls of the contact holes 204, capacitive coupling between the conductive silicon-based substrate 106 and interconnections 112, and thus capacitive coupling between adjacently positioned contact holes 204 and/or redistribution connections 114 is formed.

Figure 3:
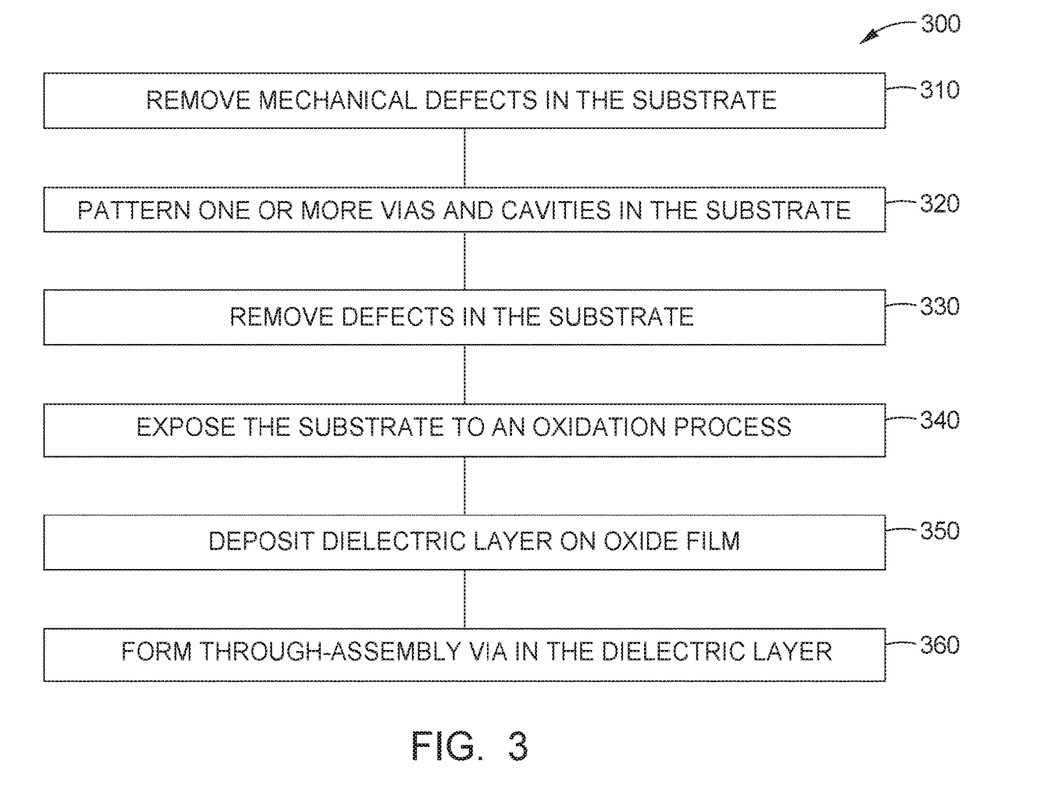
FIG. 3 illustrates a flow diagram of a method for fabricating a frame to enclose one or more semiconductor dies according to one embodiment.

FIG. 3 illustrates a flow diagram of a method 300 for fabricating a frame to enclose one or more semiconductor dies during the formation of a semiconductor package. FIGS. 4A-4G schematically illustrate cross-sectional views of a substrate 106 at different stages of the frame fabrication process 300 represented in FIG. 3. Therefore, FIG. 3 and FIGS. 4A-4G are herein described together for clarity.

Figure 4A:
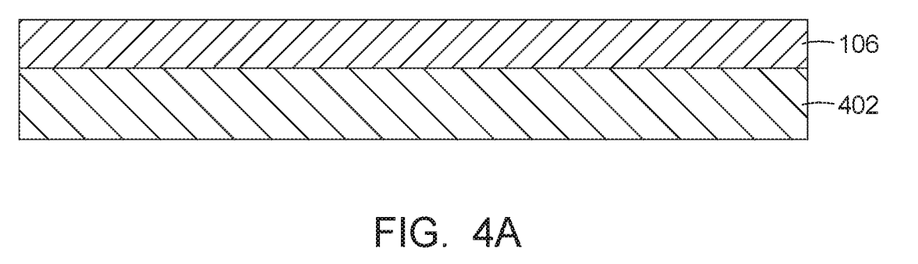
FIGS. 4A, 4B, 4C, 4D, 4E, 4F, and 4G schematically illustrate cross-sectional views of a substrate at different stages of frame formation processes according to one embodiment.

The method 300 begins with a first damage removal process at operation 310, corresponding to FIG. 4A. The substrate 106 is formed of any suitable frame material including but not limited to a III-V compound semiconductor material, silicon, crystalline silicon (e.g., Si<100> or Si<111>), silicon oxide, silicon germanium, doped or undoped silicon, doped or undoped polysilicon, silicon nitride, quartz, borosilicate glass, glass, sapphire, alumina, and ceramic. In some embodiments, the substrate 106 is a monocrystalline p-type or n-type silicon substrate. In some embodiments, the substrate 106 is a polycrystalline p-type or n-type silicon substrate. In another embodiment, the substrate 106 is a p-type or n-type silicon solar substrate. The substrate 106 may further have a polygonal or circular shape. For example, the substrate 106 may include a substantially square silicon substrate having lateral dimensions between about 25 mm and about 300 mm, for example, about 156 mm, with or without chamfered edges. In another example, the substrate 106 may include a circular silicon-containing wafer having a diameter between about 20 mm and about 700 mm, such as between about 100 mm and about 500 mm, for example, about 200 mm and about 300 mm. Unless otherwise noted, embodiments and examples described herein are conducted on substrates having a thickness between about 10 μm and about 1 mm.

Prior to the first damage removal process at operation 310, the substrate 106 may be sliced and separated from a bulk material by wire sawing, scribing and breaking, mechanical abrasive sawing, or laser cutting. Slicing typically causes mechanical defects or deformities in substrate surfaces formed therefrom, such as scratches, micro-cracking, chipping, and other mechanical defects. Thus, the substrate 106 is exposed to the first damage removal process at operation 310 to smoothen and planarize surfaces thereof and remove any mechanical defects in preparation for later structuring and packaging operations. In some embodiments, the substrate 106 may further be thinned by adjusting the process parameters of the first damage removal process at operation 310. For example, a thickness of the substrate 106 may be decreased with increased exposure to the first damage removal process at operation 310.

The first damage removal process at operation 310 includes exposing the substrate 106 to a substrate polishing process and/or an etch process followed by rinsing and drying processes. In some embodiments, operation 310 includes a chemical mechanical polishing (CMP) process. In some embodiments, the etch process is a wet etch process including a buffered etch process that is selective for the removal of undesired materials (e.g., contaminants and other undesirable compounds). In some other embodiments, the etch process is a wet etch process utilizing an isotropic aqueous etch process. Any suitable wet etchant or combination of wet etchants may be used for the wet etch process. In some embodiments, the substrate 106 is immersed in an aqueous HF etching solution for etching. In some other embodiments, the substrate 106 is immersed in an aqueous KOH etching solution for etching.

In some embodiments, the etching solution is heated to a temperature between about 30° C. and about 100° C. during the etch process, such as between about 40° C. and about 90° C. For example, the etching solution is heated to a temperature of about 70° C. In some other embodiments, the first removal process at operation 310 is a dry etch process. An example of a dry etch process includes a plasma-based dry etch process. The thickness of the substrate 106 is modulated by controlling the time of exposure of the substrate 106 to the etchants (e.g., the etching solution) used during the etch process. For example, a final thickness of the substrate 106 is reduced with increased exposure to the etchants. Alternatively, the substrate 106 may have a greater final thickness with decreased exposure to the etchants.

As depicted in FIG. 4A, the substrate 106 is placed on a stage 402 of a laser ablation system (not shown). The stage 402 may be any suitable rigid and planar or textured (e.g., structured) surface for providing mechanical support for the substrate 106 during laser ablation. In some embodiments, the stage 402 includes an electrostatic chuck for electrostatic chucking of the substrate 106 to the stage 402. In some embodiments, the stage 402 includes a vacuum chuck for vacuum chucking of the substrate 106 to the stage 402.

Figure 4B:
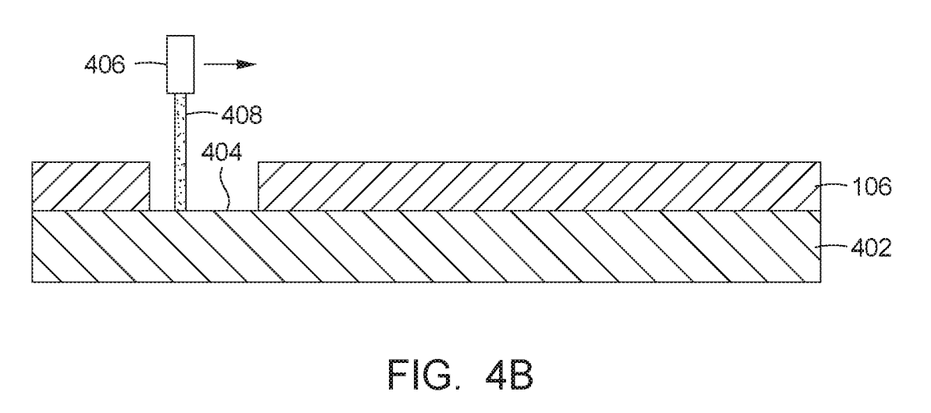
Figure 4C:
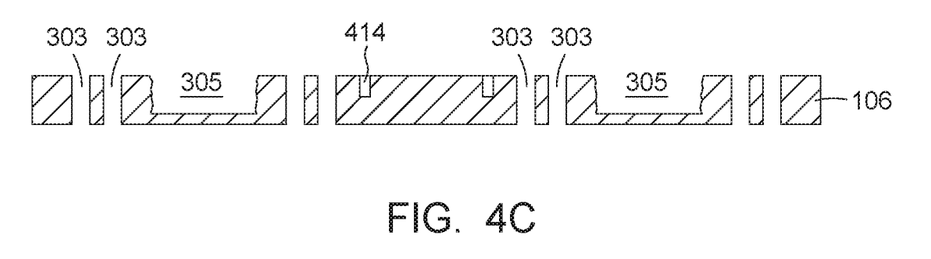

The method 300 continues to a first laser ablation process at operation 320, corresponding to FIGS. 4B and 4C. In the now planarized and substantially defect-free substrate 106 on the stage 402, one or more features 404 are formed in the substrate 106 by laser ablation, as depicted in FIG. 4B. The one or more features 404 includes through-vias 410 extending the entire thickness of the substrate 106, cavities 412, and contact holes 414. In the example shown in FIG. 4C, one cavity 412 and four through-vias 410 are depicted. The through-vias 410 are utilized to form through-assembly vias 202 to receive interconnections 110. The cavities 412 are utilized to receive and enclose one or more semiconductor dies 104 therein.

The through-vias 410 have a depth equal to the thickness of the substrate 106, thus forming holes on opposing surfaces of the substrate 106. For example, the through-vias 410 formed in the substrate 106 may have a depth of between about 10 μm and about 1 mm, depending on the thickness of the substrate 106. The cavities 412 and the contact holes 414 may have a depth less than the thickness of the substrate 106, thus forming holes in only one surface of the substrate 106. The cavities 412 may have a depth of between about 30 μm and 70 μm. The contact holes 414 may have a depth of between about 10 μm and 20 μm.

Figure 5:
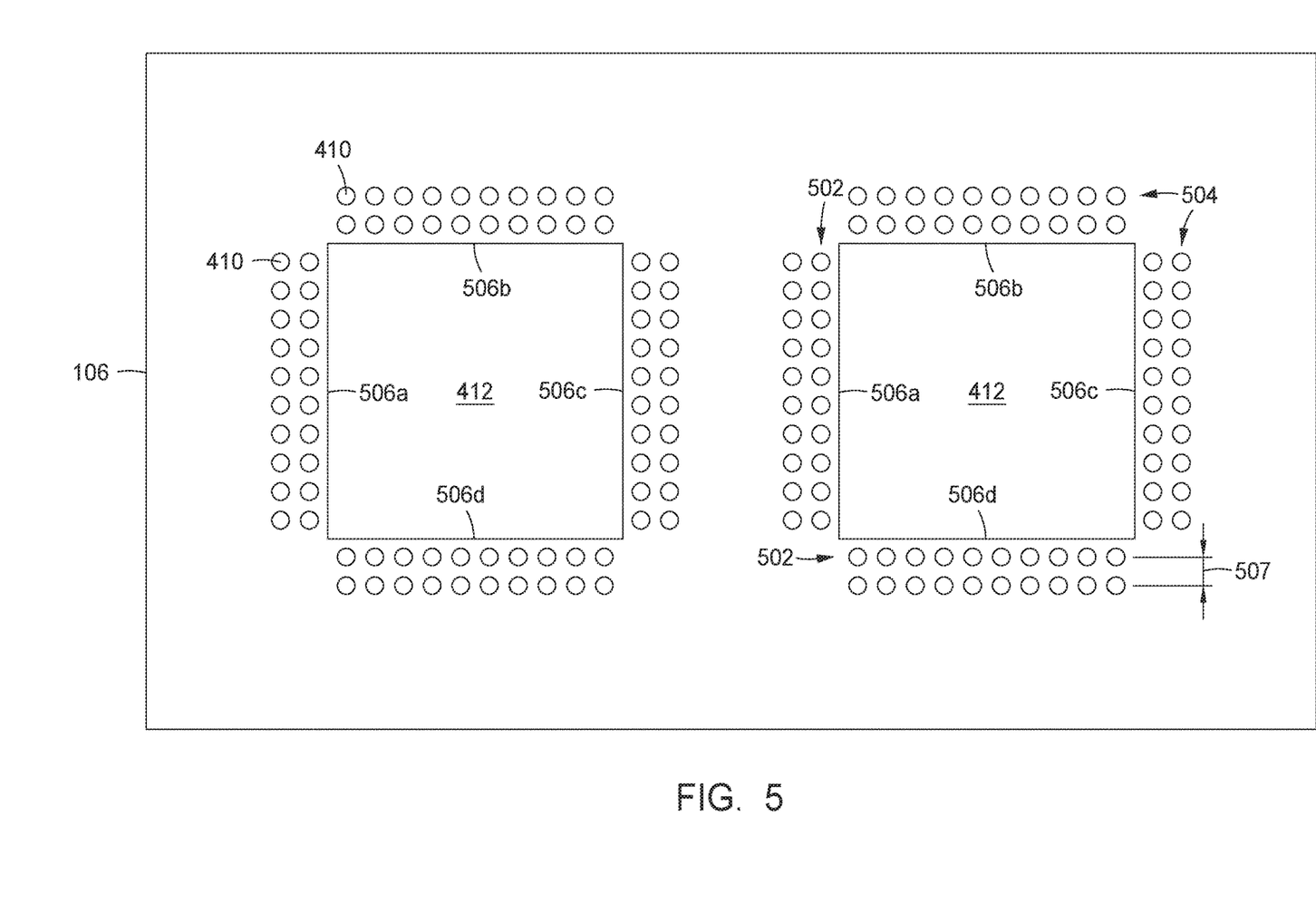
FIG. 5 illustrates a schematic top view of a structured substrate according to one embodiment.

FIG. 5 illustrates a schematic top view of an exemplary structured substrate 106. The substrate 106 may be structured during the first laser ablation process at operation 310—as described above with reference to FIGS. 4B and 4C. The substrate 106 is illustrated as having two quadrilateral cavities 412, and each cavity 412 is surrounded by a plurality of through-vias 410. Contact holes 414 are not shown. In some embodiments, each cavity 412 is surrounded by two rows 502, 504 of through-vias 410 arranged along each edge 506a-d of the quadrilateral cavity 412. Although ten through-vias 410 are depicted in each row 502, 504, it is contemplated that any desired number of through-vias 410 may be formed in a row. Further, any desired number and arrangement of cavities 412 and through-vias 410 may be formed in the substrate 106 during the first laser ablation process at operation 320. For example, the substrate 106 may have more or less than two cavities 412 formed therein. In another example, the substrate 106 may have more or less than two rows of through-vias 410 formed along each edge 506a-d of the cavities 412. In another example, the substrate 106 may have two or more rows of through-vias 410 where the through-vias 410 in each row are staggered and unaligned with through-vias 410 of another row.

In some embodiments, each cavity 412 has lateral dimensions ranging between about 1 mm and about 50 mm, such as about 8.6 mm, depending on the size of one or more semiconductor dies 104 to be enclosed and embedded therein during fabrication of semiconductor packages 102. In some embodiments, the cavities 412 are sized to have lateral dimensions substantially similar to that of the semiconductor dies 104 to be embedded therein. For example, each cavity 412 is formed having lateral dimensions exceeding those of the semiconductor dies 104 by less than about 150 μm, such as less than about 120 μm, such as less than 100 μm. Having a reduced variance in the size of the cavities 412 and the semiconductor dies 104 to be embedded therein reduces the amount of gap-fill material utilized thereafter.

In some embodiments, each through-via 410 has a diameter ranging between about 50 μm and about 200 μm, such as about 90 μm. A minimum pitch 507 between the row 502 and the row 504 is between about 30 μm and about 170 μm, such as about 40 μm. Although embodiments are described with reference to FIG. 5, the substrate structuring processes described above with reference to operation 320 and FIGS. 4B and 4C may be utilized to form patterned features in the substrate 106 having any desired depth, lateral dimensions, and morphologies.

Referring back to the first laser ablation process at operation 320 and FIGS. 4B and 4C, the laser ablation system includes a laser source 406. In some embodiments, the laser source 406 is an infrared (IR) laser. The laser source 406 generates a continuous or pulsed laser beam 408 to irradiate the substrate 106 for forming one or more features 404. For example, the laser source 406 may generate a pulsed laser beam 408 having a frequency between 5 kHz and 200 kHz. In one example, the laser source 406 is configured to deliver a pulsed laser beam at a pulse duration between about 15 ns and 5 μs, with a pulse energy of between about 0.5 millijoules (mJ) and about 10 mJ.

In the embodiments described herein, frequency, pulse width, and pulse energy of a pulsed laser beam 408 generated by the laser source 406 are tuned depending on a depth of the one or more features 404 that are drilled into the substrate 106.

For example, for drilling through-vias 410 having a diameter of about 90 μm through a thin silicon-based substrate 106, having a thickness of between about 100 μm and about 200 μm, the laser source 406 may be tuned to have the frequency of between about 5 kHz and about 100 kHz, the pulse energy of between about 0.5 mJ and between about 4.5 mJ, for example, between about 0.8 mJ and about 1.2 mJ at frequency of about 100 kHz, and between about 3.5 mJ and about 4.5 mJ at frequency of about 5 kHz, and the pulse width of between about 100 ns and about 1200 ns. For example, at frequency of about 5 kHz and a pulse width of about 600, material volume of between about 70,000 μm$^3$ and about 110,000 μm$^3$ is removed per laser pulse. At frequency of about 100 kHz and a pulse width of about 600 ns, material volume of between about 18,000 μm$^3$ and about 26,000 μm$^3$ is removed per laser pulse. The amount of energy supplied to the material per unit volume is between about 35 J/mm$^3$ and 60 J/mm$^3$.

For drilling through-vias 410 having a diameter of about 90 μm through a thick silicon substrate 106 having a thickness of between about 500 μm and about 1 mm, the laser source 406 may be tuned to have the frequency of between about 5 kHz and about 30 kHz, the pulse energy of between about 2 mJ and about 10 mJ, for example, between about 2 mJ and about 3.5 mJ at frequency of about 30 kHz, and between about 7 mJ and about 10 mJ at frequency of about 5 kHz, and the pulse width of between about 1 μs and about 5 μs. For drilling cavities 412 having lateral dimensions of about 8.6 mm and depth of between about 50 μm and 200 μm, the laser source 406 may be tuned to have the frequency of between about 5 kHz and about 40 kHz, the pulse energy of between about 0.5 mJ and about 4.5 mJ, and the pulse width of between about 15 ns and about 600 ns. For example, at frequency of about 5 kHz and a pulse width of about 600 ns, material volume of about 30,000 μm$^3$ and 50,000 μm$^3$ is removed per pulse. At frequency of about 5 kHz and a pulse width of about 2 is, material volume of about 220,000 μm$^3$ and 400,000 μm$^3$ is removed per pulse. At frequency of about 30 kHz and a pulse width of about 2 μs, material volume of about 95,000 μm$^3$ and about 110,000 μm$^3$ is removed per laser pulse. The amount of energy supplied to the material per unit removed is about 60 J/mm$^3$ and 75 J/mm$^3$.

While not intending to be bound by theory, it is believed that during laser ablation processes, material being drilled melts and a fraction of the molten material in a liquid state vaporizes to develop hot plasma. This plasma plume tends to be opaque to laser beams and thus for laser drilling, and thus the rate that laser beams can be delivered to the material being drilled is limited by this "plasma screening" effect. However, this plasma screening effect can be reduced if a laser pulse energy required for laser drilling is distributed over a longer pulse duration and a significant amount of the pulse energy is used to melt the material being drilled without vaporizing the molten material. Thus, the rate of laser drilling is enhanced with laser pulses with a longer pulse width as compared with laser pulses with a shorter pulse width.

Figure 6:
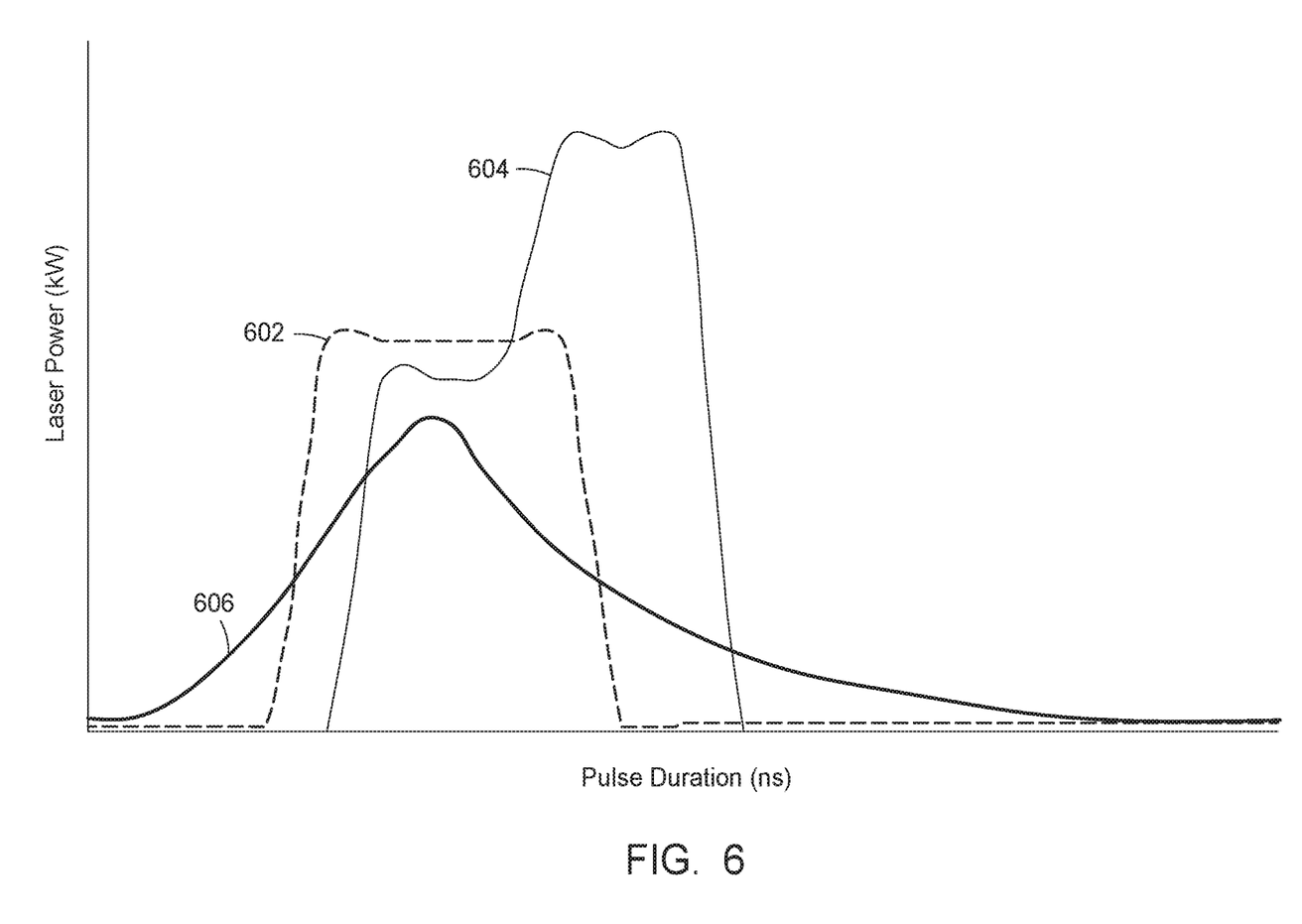
FIG. 6 illustrates temporal profiles instantaneous laser power of a pulsed laser beam according to one embodiment.

In some embodiments, pulsed laser beams 408 delivered from the laser source 407 are programmed to generate a rectangular temporal profile 602 of instantaneous laser power, as shown in FIG. 6, by methods known in the art. The rectangular temporal profile 602 of instantaneous laser power ensures a moderate heating rate to avoid overheating (i.e., vaporizing molten material) and enhances the efficiency of laser drilling. In some embodiments, pulsed laser beams 408 delivered from the laser source 406 are programmed to generate a chair-shaped temporal profile 604 of instantaneous laser power, as shown in FIG. 6, by methods known in the art, which may further enhance the efficiency of laser drilling. It has been shown by the inventors of the present application that vias drilled by pulsed laser beams 408 having a rectangular temporal profile 602 have straighter and smoother inner walls as compared to vias drilled by laser pulses having a classical Q-switch temporal profile 608, as shown in FIG. 6.

As noted above, excess laser energy beyond the requirement for melting the material results in partial vaporization. Thus, weighting the pulse energy content toward the back end of the laser pulse may have a beneficial effect. In the early part of the pulse, slow energy delivery due to a moderate heating rate melts a larger volume of the material being drilled. This compares and contrasts with laser drilling with laser pulse having a classical Q-switch temporal profile 608, in which the temporal profile peaks relatively early in the pulse, delivering high energy at a time (early in the pulse) when lower energy is required. Thus, a larger fraction of the laser pulse energy is consumed in excess vaporization and possible ionization of the ablation plume. Laser pulses with the temporal profile 602 or the chair-shaped temporal profile 604 allow efficient laser drilling without consuming the laser energy early in the pulses in vaporizing molten materials that are being drilled.

When drilling a large array of features 404, there are two commonly used methods, percussion drilling and on-the-fly drilling. Percussion drilling is a process where multiple laser pulses are applied to the substrate 106 per feature 404 until the feature 404 is formed. On-the-fly drilling is a process where one laser pulse is applied to the substrate 106 per feature 404 in a sub-set of features 404 and repeated until the features 404 in the sub-set are formed, while the substrate 106 moves at high speed with respect to the laser beam and the laser continuously applies pulses to form the features 404. In some embodiments, in an on-the-fly drilling process, a pulsed laser beam 408 is positioned synchronically with a scan motion of a galvo-scanner for high speed beam positioning, for example, at a speed of about 10 m/s, and repeatedly over the sub-set of features 404. The "plasma screening" effect is reduced compared with one-the-fly drilling in which each feature 404 (e.g., hole) is completely drilled with successive laser pulses at a very high repetition rate, and the pulsed laser beam 408 is then moved on to the location of the next feature 404 (e.g., hole). This is due to reduction in effective drilling repetition rate on any one feature 404 with the on-the-fly drilling, thus avoiding "plasma screening" effect. The effective drilling repetition rate on any one feature 404 is approximately the laser repetition rate divided by the total number of feature 404 being drilled. In some embodiments, the sub-set of features 404 includes between about 1000 and about 2,500,000 features 404 that are drilled by synchronous drilling.

The inventors of the present disclosure have found that straightness and smoothness of inner walls of a hole, such as a via, are largely related to an ablation depth per laser pulse. The ablation depth increases with optical penetration depth, thermal penetration depth, and laser fluence (i.e., energy per unit area). With a near infrared laser having a wavelength of about 1.0 μm used in the example embodiments described herein, a long pulse width ensures the optical penetration depth (that is proportional to a square root of a pulse width) to be sufficiently large. Therefore, the laser pulse energy is more uniformly distributed over a long distance through a substrate, so as to simultaneously heat up and melt a thick substrate material, leading to more efficient ablation. Ablated material has a large momentum (i.e., mass multiplied by speed) and a more directional motion that favors ejecting out of the hole without being re-deposited on the inner walls. This leads to straighter and smoother inner walls of a hole being drilled. This is in contrast with an intensive ablation by a laser with a shorter wavelength (such as a 355 nm UV laser) and a shorter pulse width, in which only a surface of a substrate is ablated. In ablation with a laser with such short pulse width, a much smaller amount of material is ablated, but ablated explosively as a mixture of overheated melt, vapor, and plasma, having a much less directional ejection out of a hole being drilled and inducing re-deposition on inner walls of the hole.

Figure 4D:
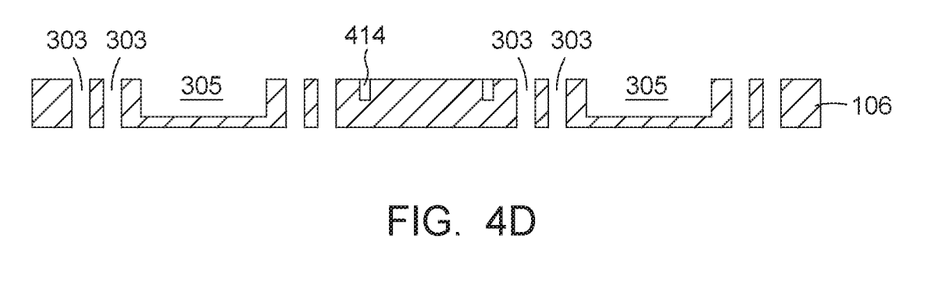

The method 300 continues to a second damage removal process at operation 330, corresponding to FIG. 4D. The first laser ablation process at operation 320 described above for forming one or more features 404 in the substrate 106 may cause unwanted mechanical defects on the surfaces of the substrate 106, such as chipping and cracking. Therefore, after performing the first laser ablation process at operation 320 to form desired features 404 in the substrate 106, the substrate 106 is exposed to the second damage removal and cleaning process at operation 330 to smoothen the surfaces of the substrate 106 and remove unwanted debris.

The second damage removal process at operation 330 is substantially similar to the first damage removal process at operation 310 and includes exposing the substrate 106 to an etch process, followed by rinsing and drying. FIGS. 4C and 4D illustrate the structured substrate 106 before and after performing the second damage removal and cleaning process, resulting in a smoothened substrate 106 having a cavity 412 and four through-vias 410 formed therein.

Figure 4E:
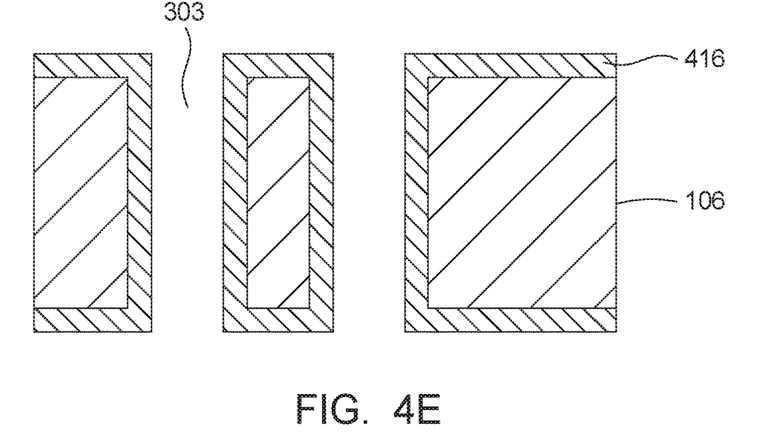

The method 300 continues to an oxidation process at operation 340, corresponding to FIG. 4E. After removal of mechanical defects in the substrate 106 in the second damage removal process at operation 330, an insulating oxide film (i.e., layer) 416 is deposited on the substrate 106. For example, the oxide film 416 may be formed on all surfaces of the substrate 106 such that it surrounds the substrate 106. The insulating oxide film 416 acts as a passivating layer on the substrate 106 and provides a protective outer barrier against corrosion and other forms of damage. In some embodiments, the oxidation process is a thermal oxidation process. The thermal oxidation process is performed at a temperature of between about 800° C. and about 1200° C., such as between about 850° C. and about 1150° C. For example, the thermal oxidation process is performed at a temperature of between about 900° C. and about 1100° C., such as a temperature of between about 950° C. and about 1050° C. In some embodiments, the thermal oxidation process is a wet oxidation process utilizing water vapor as an oxidant. In some embodiments, the thermal oxidation process is a dry process utilizing molecular oxygen as the oxidant. It is contemplated that the substrate 106 may be exposed to any suitable oxidation process at operation 340 to form the oxide film 416 thereon. The oxide film 416 generally has a thickness between about 100 nm and about 3 µm, such as about 0.7 µm.

Figure 4F:
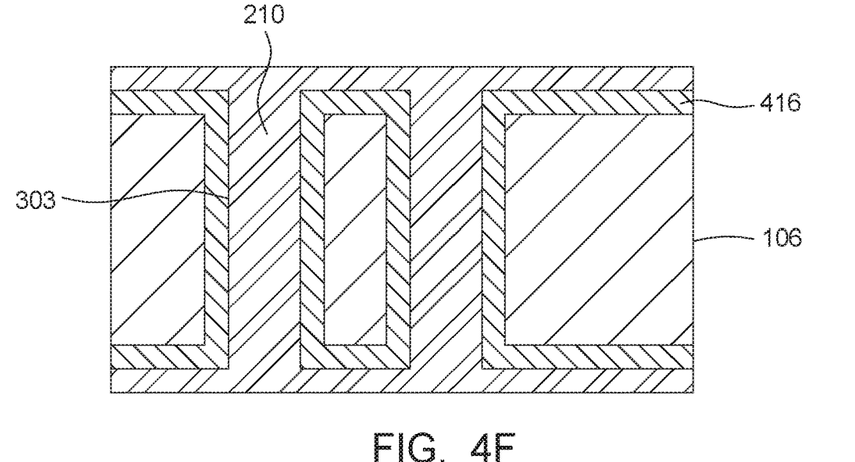

The method 300 continues to a filling process at operation 350, corresponding to FIG. 4F. A dielectric layer 210 is deposited on surfaces of the oxide film 416 and fills the through-vias 410. The dielectric material for the dielectric layer 210 may be an organic dielectric, such as Ajionomoto ABF Series Bonding Sheets and Mitsubishi BT Film.

Figure 4G:
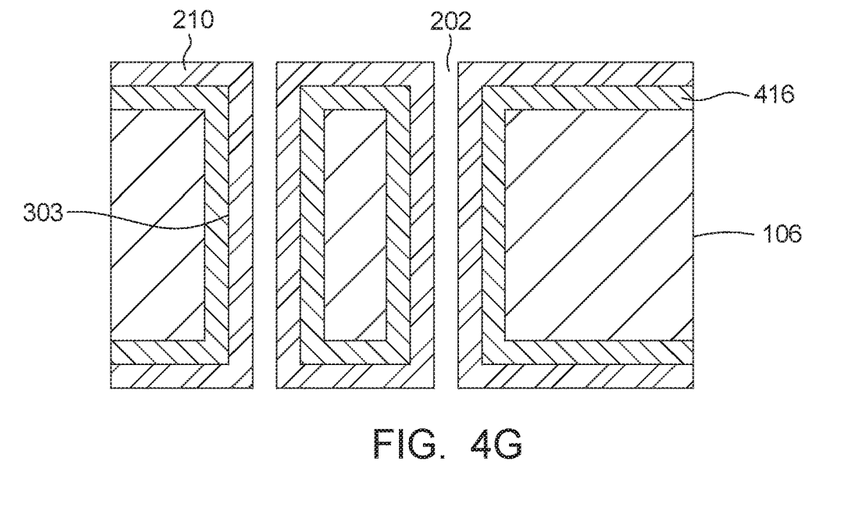

The method 300 continues to a second laser ablation process at operation 360, corresponding to FIG. 4G. A through-assembly via (referred to also as a "via-in-via") 202 is formed in the dielectric layer 210 by laser ablation. The through-assembly vias 202 receive interconnections 110 therewithin. The second laser drilling process at operation 360 is similar to the first laser drilling process at operation 320, but performed with an ultraviolet (UV) laser light with a much lower pulse energy than the first laser ablation process at operation 320. In the embodiments described herein, frequency, pulse width, and pulse energy of a pulsed laser beam 408 generated by the laser source 406 to irradiate the dielectric layer 210 are tuned depending on a depth of through-assembly vias 202 that are drilled into the dielectric layer 210. For example, for drilling through-assembly vias 202 having a diameter of about 30 µm through a dielectric layer 210, having a thickness of between about 100 µm and about 200 µm, the laser source 406 may be tuned to have the frequency of between about 10 kHz and about 1000 kHz, the pulse energy of between about 25 µJ and between about 250 µJ, and the pulse width of between 3 ns and 60 ns. For drilling through-assembly vias 202 having a diameter of about 30 µm through dielectric layer 210 having a thickness of between about 500 µm and about 1 mm, the laser source 406 may be tuned to have the frequency of between about 5 kHz and about 100 kHz, the pulse energy of between about 0.100 mJ and about 0.400 mJ, and the pulse width of between about 3 ns and about 60 ns. For example, at frequency of about 100 kHz, material volume of about 1,000 µm$^3$ and 3,000 µm$^3$ is removed per laser pulse. The amount of energy supplied to the dielectric layer 210 per unit volume is between about 0.5 J/mm$^3$ and 3.0 J/mm$^3$. At frequency of about 10 kHz, material volume of between about 4,000 µm$^3$ and 5,500 µm$^3$ is removed per laser pulse. The amount of energy supplied to the dielectric layer 210 per unit volume is between about 0.1 J/mm$^3$ and 0.3 J/mm$^3$.

The methods disclosed herein include methods for forming a semiconductor package. In one embodiment, a substrate is patterned, by laser ablation to enable formation of interconnections therethrough. The substrate is thereafter utilized as a package frame for forming one or more semiconductor packages with semiconductor dies disposed therein. The methods disclosed herein include tuning of pulsed laser beams used for forming features in a substrate. Specifically, frequency, pulse width, and pulse energy of pulsed laser beams are tuned based on sizes of the features and the material in which the features are formed. The appropriate tuning of pulsed laser beams used for laser beams allows rapid formation of features in semiconductor substrates with controlled depth and topography.

While the foregoing is directed to embodiments of the present disclosure, other and further embodiments of the disclosure may be devised without departing from the basic scope thereof, and the scope thereof is determined by the claims that follow.

What is claimed is:

1. A method of fabricating a frame to enclose one or more semiconductor dies, comprising:
    forming one or more features in a substrate by a first laser ablation process, the one or more features comprising:
        one or more cavities configured to enclose one or more semiconductor dies therein; and
        one or more through-vias extending through the substrate;
    filling the one or more through-vias with a dielectric material; and
    forming a via-in-via in the dielectric material filled in each of the one or more through-vias by a second laser ablation process, wherein:
        in the first laser ablation process, frequency, pulse width, and pulse energy of a first pulsed laser beam to irradiate the substrate are tuned based on a depth of the one or more features, and
        in the second laser ablation process, frequency, pulse width, and pulse energy of a second pulsed laser beam to irradiate the dielectric material are tuned based on a depth of the via-in-via.

2. The method of claim 1, wherein the substrate comprises silicon.

3. The method of claim 2, wherein:
    the one or more cavities have a lateral dimension of between 3 mm and 50 mm and a depth of between 50 µm and 200 µm, and
    the first pulsed laser beam is tuned to have the frequency of 5 kHz and 40 kHz, the pulse energy of between 0.5 mJ and 4.5 mJ, and the pulse width of between 15 ns and 600 ns.

4. The method of claim 2, wherein:
    the one or more through-vias have a diameter between 50 µm and 200 µm, and
    the via-in-via in each of the one or more through-vias has a diameter of between 20 µm and 70 µm.

5. The method of claim 4, wherein:
    the substrate has a thickness of between 100 µm and 200 µm, and
    the first pulsed laser beam is tuned to have the frequency of between 5 kHz and 100 kHz, the pulse energy of between 0.5 mJ and between 4.5 mJ, and the pulse width of between 100 ns and 1200 ns.

6. The method of claim 5, wherein:
    the second pulsed laser beam is tuned to have the frequency of between 10 kHz and 1000 kHz, the pulse energy of between 25 µJ and between 250 µJ, and the pulse width of between 3 ns and 60 ns.

7. The method of claim 4, wherein:
    the substrate has a thickness of between 500 µm and 1 mm, and
    the first pulsed laser beam is tuned to have the frequency of between 5 kHz and 30 kHz, the pulse energy of between 2 mJ and 10 mJ, and the pulse width of between 1 µs and 5 µs.

8. The method of claim 7, wherein:
    the second pulsed laser beam is tuned to have the frequency of between 5 kHz and 100 kHz, the pulse energy of between 0.1 mJ and between 0.4 mJ, and the pulse width of between 3 ns and 60 ns.

9. A method of patterning a substrate, comprising:
    forming one or more features in a substrate by irradiating the substrate with a pulsed laser beam, wherein the substrate comprises silicon, and wherein the one or more features have a diameter between 50 µm and 200 µm and a depth of between 100 µm and 200 µm; and tuning frequency, pulse width, and pulse energy of the pulsed laser beam based on a depth of the one or more features, wherein the pulsed laser beam is tuned to have the frequency of between 5 kHz and 100 kHz, the pulse energy of between 0.5 mJ and between 4.5 mJ, and the pulse width of between 100 ns and 1200 ns.

10. The method of claim 9, wherein a sub-set of the one or more features is formed by on-the-fly drilling.

11. A method of patterning a substrate, comprising:
forming one or more features in a substrate by irradiating the substrate with a pulsed laser beam, wherein the substrate comprises silicon, and wherein the one or more features have a diameter between 50 μm and 200 μm and a depth of between 500 μm and 1 mm; and
tuning frequency, pulse width, and pulse energy of the pulsed laser beam based on a depth of the one or more features, wherein the pulsed laser beam is tuned to have the frequency of between 5 kHz and 30 kHz, the pulse energy of between 2 mJ and 10 mJ, and the pulse width of between 1 μs and 5 μs.

12. The method of claim 11, wherein a sub-set of the one or more features is formed by on-the-fly drilling.

13. A method of patterning a substrate, comprising:
forming one or more features in a substrate by irradiating the substrate with a pulsed laser beam, wherein the substrate comprises silicon, and wherein the one or more features have a lateral dimension of between 3 mm and 50 mm and a depth of between 50 μm and 200 μm; and
tuning frequency, pulse width, and pulse energy of the pulsed laser beam based on a depth of the one or more features, wherein the pulsed laser beam is tuned to have the frequency of 5 kHz and 40 kHz, the pulse energy of between 0.5 mJ and 4.5 mJ, and the pulse width of between 15 ns and 600 ns.

14. The method of claim 13, wherein a sub-set of the one or more features is formed by on-the-fly drilling.

15. A method of fabricating a die assembly, comprising:
forming a frame, comprising:
  forming one or more features in a substrate by a first laser ablation process, the one or more features comprising one or more cavities and one or more through-vias extending through the substrate;
  filling the one or more through-vias with a dielectric material; and
  forming a via-in-via in the dielectric material filled in each of the one or more through-vias by a second laser ablation process;
disposing one or more semiconductor dies within the one or more cavities; and
disposing an interconnection within the via-in-via, wherein:
  in the first laser ablation process, frequency, pulse width, and pulse energy of a first pulsed laser beam to irradiate the substrate are tuned based on a depth of the one or more features, and
  in the second laser ablation process, frequency, pulse width, and pulse energy of a second pulsed laser beam to irradiate the dielectric material are tuned based on a depth of the via-in-via.

16. The method of claim 15, wherein the substrate comprises silicon.

17. The method of claim 16, wherein:
the one or more cavities have a lateral dimension of between 3 mm and 50 mm and a depth of between 50 μm and 200 μm, and
the first pulsed laser beam is tuned to have the frequency of 5 kHz and 40 kHz, the pulse energy of between 0.5 mJ and 4.5 mJ, and the pulse width of between 15 ns and 600 ns.

18. The method of claim 16, wherein:
the one or more through-vias have a diameter between 50 μm and 200 μm, and
the via-in-via in each of the one or more through-vias has a diameter of between 20 μm and 70 μm.

19. The method of claim 18, wherein:
the substrate has a thickness of between 500 μm and 1 mm, and
the first pulsed laser beam is tuned to have the frequency of between 5 kHz and 30 kHz, the pulse energy of between 2 mJ and 10 mJ, and the pulse width of between 1 μs and 5 μs.

20. The method of claim 19, wherein:
the second pulsed laser beam is tuned to have the frequency of between 5 kHz and 100 kHz, the pulse energy of between 0.1 mJ and between 0.4 mJ, and the pulse width of between 3 ns and 60 ns.

* * * * *